United States Patent
Kim

(10) Patent No.: US 8,295,121 B2
(45) Date of Patent: Oct. 23, 2012

(54) CLOCK BUFFER AND A SEMICONDUCTOR MEMORY APPARATUS USING THE SAME

(75) Inventor: Kwan Dong Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 564 days.

(21) Appl. No.: 12/476,387

(22) Filed: Jun. 2, 2009

(65) Prior Publication Data
US 2010/0091592 A1 Apr. 15, 2010

(30) Foreign Application Priority Data
Oct. 13, 2008 (KR) .................. 10-2008-0100258

(51) Int. Cl.
*G11C 8/18* (2006.01)

(52) U.S. Cl. ............. 365/233.11; 365/194; 365/233.12; 327/153; 713/401

(58) Field of Classification Search .................. 365/194, 365/233.1–233.13; 327/291–297, 161, 153; 713/401
See application file for complete search history.

(56) References Cited

U.S. PATENT DOCUMENTS

| | | | |
|---|---|---|---|
| 5,955,904 A | 9/1999 | Kawasaki | |
| 6,269,050 B1 | 7/2001 | Kwon et al. | |
| 6,898,683 B2 | 5/2005 | Nakamura | |
| 6,914,798 B2 * | 7/2005 | Kwon et al. | 365/145 |
| 6,980,479 B2 * | 12/2005 | Park | 365/189.02 |
| 7,385,430 B2 * | 6/2008 | Lee | 327/291 |
| 7,916,562 B2 * | 3/2011 | Ku | 365/194 |
| 7,944,260 B2 * | 5/2011 | Kim | 327/158 |
| 2007/0146040 A1 * | 6/2007 | Lee | 327/291 |

FOREIGN PATENT DOCUMENTS

| | | |
|---|---|---|
| JP | 2000-163961 | 6/2000 |
| KR | 1019980078944 | 11/1998 |
| KR | 1020080063877 | 7/2008 |

* cited by examiner

*Primary Examiner* — Tuan T Nguyen
*Assistant Examiner* — Lance Reidlinger
(74) *Attorney, Agent, or Firm* — IP & T Group LLP

(57) ABSTRACT

A clock buffer includes a reference enable signal generator configured to generate a reference enable signal enabled in synchronization with a rising edge of a first period of a second clock after a clock enable signal is enabled, a delay enable signal generator configured to generate a delayed enable signal enabled in synchronization with a rising edge of a second period of a first clock after the reference enable signal is enabled, a first output unit configured to receive the reference enable signal and the first clock to generate a first internal clock, and a second output unit configured to receive the delayed enable signal and the second clock to generate a second internal clock.

16 Claims, 5 Drawing Sheets

CLOCK BUFFER AND A SEMICONDUCTOR MEMORY APPARATUS USING THE SAME

CROSS-REFERENCES TO RELATED APPLICATION

The present application claims priority under 35 U.S.C. 119(a) to Korean application number 10-2008-0100258, filed on Oct. 13, 2008 in the Korean Patent Office, the disclosure of which is incorporated herein by reference in its entirety as if set forth herein in full.

BACKGROUND

1. Technical Field

The embodiment described herein relates to a semiconductor memory apparatus. More particularly, the embodiment described herein relates to a clock buffer and a semiconductor memory apparatus using the same.

2. Related Art

A semiconductor memory apparatus, particularly, a dynamic random access memory (DRAM) generates a delay clock synchronized with an external clock and operates in synchronization with the delay clock. The delay clock is input to a clock buffer provided in the DRAM, and the clock buffer transfers the delay clock to circuits, which operate in synchronization with the delay clock, in response to an enable signal that activates the clock buffer.

In general, in order to reduce power consumption, the DRAM may inactivate the clock buffer and then operate the clock buffer only when a signal representing an output of the delay clock, that is, the enable signal is activated.

FIG. 1 is a circuit diagram showing a configuration of a conventional clock buffer. The conventional clock buffer includes first and second AND gates AND1 and AND2. The first AND gate AND1 receives a first clock 'rclk' and a clock enable signal 'clken' to generate a first internal clock 'rclk_d'. The second AND gate AND2 receives a second clock 'fclk' and the clock enable signal 'clken' to generate a second internal clock 'fclk_d'. The first and second clocks 'rclk' and 'fclk' are delay clocks synchronized with an external clock, and refer to a pair of clocks having a phase difference of 180° therebetween.

FIGS. 2 and 3 are timing charts showing an operation of the conventional clock buffer.

FIG. 2 shows a case in which the clock enable signal 'clken' is enabled when the first clock 'rclk' is at a high level and the second clock 'fclk' is at a low level. In such a case, the first clock 'rclk' is primarily output as the first internal clock 'rclk_d' and then the second clock 'fclk' is output as the second internal clock 'fclk_d'.

FIG. 3 shows a case in which the clock enable signal 'clken' is enabled when the first clock 'rclk' is at a low level and the second clock 'fclk' is at a high level. In such a case, the second clock 'fclk' is primarily output as the second internal clock 'fclk_d' and then the first clock 'rclk' is output as the first internal clock 'rclk_d'.

As described above, the sequence of the outputted clock may vary depending on the enable timing point of the clock enable signal 'clken'. When operating a semiconductor memory apparatus by primarily outputting the first clock 'rclk' as the first internal clock 'rclk_d', the semiconductor memory apparatus can normally operate in the case of FIG. 2. However, in the case of FIG. 3, if the second clock 'fclk' is primarily output as the second internal clock 'fclk_d', the semiconductor memory apparatus may abnormally operate.

SUMMARY

A clock buffer capable of outputting clocks in a desired sequence and a semiconductor memory apparatus using the same are described herein.

According to one aspect, a clock buffer includes a reference enable signal generator configured to generate a reference enable signal enabled in synchronization with a rising edge of a first predetermined period of a second clock after a clock enable signal is enabled, a delay enable signal generator configured to generate a delayed enable signal enabled in synchronization with a rising edge of a second predetermined period of a first clock after the reference enable signal is enabled, a first output unit configured to receive the reference enable signal and the first clock to generate a first internal clock, and a second output unit configured to receive the delayed enable signal and the second clock to generate a second internal clock.

According to another aspect, a semiconductor memory apparatus includes a clock generator configured to generate a first clock and a second clock that are toggled in synchronization with an external clock, a clock buffer configured to receive a clock enable signal, and the first and second clocks to generate a reference enable signal and a delayed enable signal, and further configured to generate first and second internal clocks in synchronization with the reference enable signal and the delayed enable signal, and a clock synchronization circuit configured to be driven in response to the first and second internal clocks.

According to yet another aspect, a clock buffer comprises a flip-flop configured to generate output data having a first level regardless of a voltage level of an input clock when input data has the first level, and to generate output data, which transits to a second level in synchronization with a rising edge of the input clock and is maintained at the second level, when the input data transitions to the second level.

Theses and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
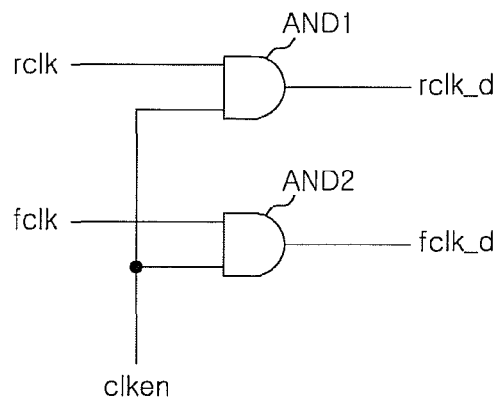
FIG. 1 is a circuit diagram schematically showing a configuration of a conventional clock buffer.
Figure 2:
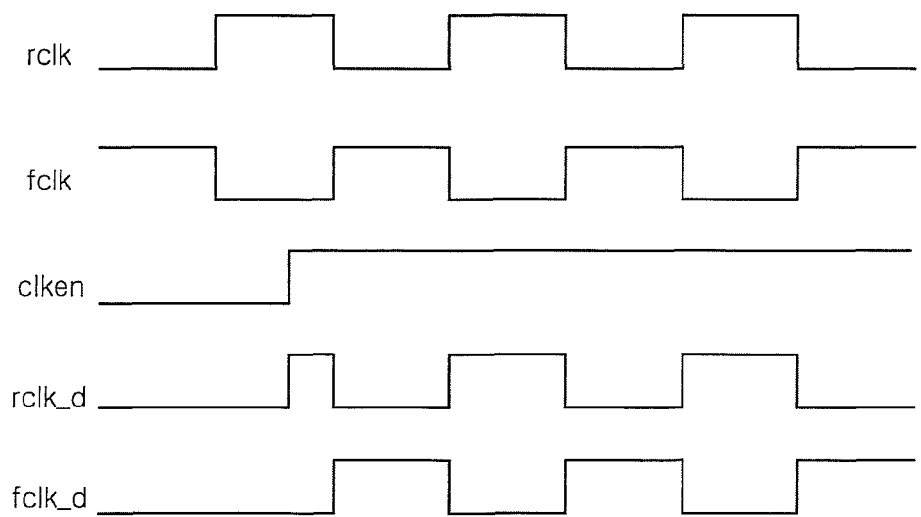
FIG. 2 is a timing chart showing an operation of a conventional clock buffer.
Figure 3:
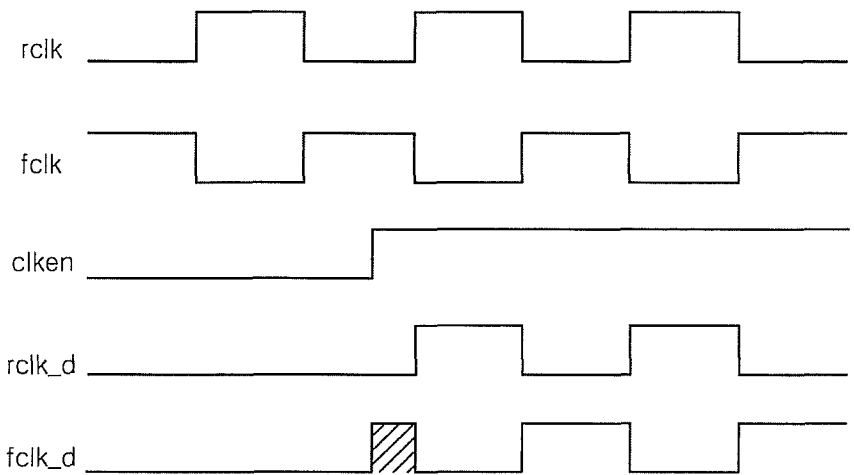
FIG. 3 is a timing chart showing another operation of a conventional clock buffer.
Figure 4:
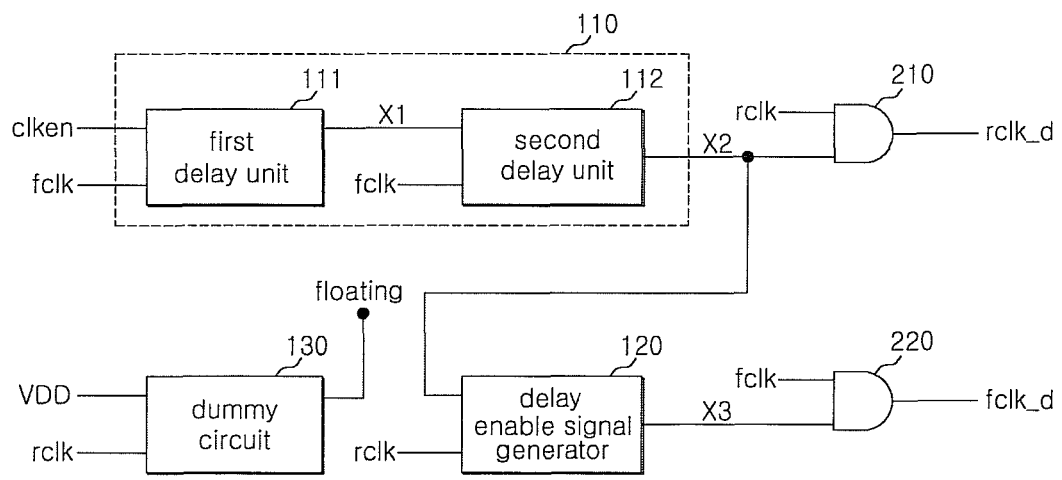
FIG. 4 is a block diagram schematically showing a configuration of a clock buffer according to an embodiment of the present disclosure.

FIG. 4 is a block diagram schematically showing a configuration of a clock buffer according to an embodiment of the present disclosure. The clock buffer according to the embodiment of the present disclosure can include a reference enable signal generator 110, a delay enable signal generator 120, a first output unit 210 and a second output unit 220.

The reference enable signal generator 110 can receive a clock enable signal 'clken' and a second clock 'fclk' to generate a reference enable signal 'X2'. In detail, after the clock enable signal 'clken' is enabled, the reference enable signal generator 110 can generate the reference enable signal 'X2' enabled in synchronization with a rising edge of a first predetermined period of the second clock 'fclk'. For example, after the clock enable signal 'clken' is enabled, the reference enable signal generator 110 can generate the reference enable signal 'X2' enabled in synchronization with a rising edge of a second period of the second clock 'fclk'. However, the present disclosure is not limited thereto. It is possible to adjust a timing point of enabling of the reference enable signal 'X2' to be synchronized with a rising edge of a predetermined period of the second clock 'fclk' according to application. That is, when a semiconductor memory apparatus operates at a high speed, the reference enable signal 'X2' can be enabled in synchronization with a rising edge of a third or fourth period/cycle of the second clock 'fclk', instead of the rising edge of the second period of the second clock 'fclk'.

In the embodiment of the present disclosure, the reference enable signal generator 110 can include a first delay unit 111 and a second delay unit 112. The first delay unit 111 can receive the clock enable signal 'clken' and the second clock 'fclk' to generate an intermediate delay signal 'X1'. In detail, after the clock enable signal 'clken' is enabled, the first delay unit 111 can enable the intermediate delay signal 'X1' in synchronization with the rising edge of the first period of the second clock 'fclk'.

The second delay unit 112 can receive the intermediate delay signal 'X1' and the second clock 'fclk' to generate the reference enable signal 'X2'. In detail, after the intermediate delay signal 'X1' is enabled, the second delay unit 112 can enable the reference enable signal 'X2' in synchronization with the rising edge of the first period of the second clock 'fclk'.

Thus, the reference enable signal generator 110 includes the first and second delay units 111 and 112 to generate the reference enable signal 'X2' enabled in synchronization with the rising edge of the second period of the second clock 'fclk' after the clock enable signal 'clken' is enabled. Those skilled in the art will appreciate that the number of the delay units included in the reference enable signal generator 110 is increased to enable the reference enable signal 'X2' in synchronization with the rising edge of the third period or later period of the second clock 'fclk'.

The delay enable signal generator 120 can receive the reference enable signal 'X2' and a first clock 'rclk' to generate a delayed enable signal 'X3'. In detail, after the reference enable signal 'X2' is enabled, the delay enable signal generator 120 can generate the delayed enable signal 'X3' enabled in synchronization with a rising edge of a second predetermined period of the first clock 'rclk'. For example, after the reference enable signal 'X2' is enabled, the delay enable signal generator 120 generates the delayed enable signal 'X3' enabled in synchronization with a rising edge of a first period of the first clock 'rclk'.

The first clock 'rclk' and the second clock 'fclk' refer to a pair of clocks having a phase difference therebetween. Preferably, the first clock 'rclk' and the second clock 'fclk' refer to a pair of clocks having a phase difference of 180° therebetween. Thus, the time interval between enable timing points of the reference enable signal 'X2' and the delayed enable signal 'X3' may be a half period 'halftCk' of a clock or less. However, the present disclosure is not limited thereto. That is, the delay enable signal generator 120 can include a plurality of delay units to generate the delayed enable signal 'X3' enabled with a time interval longer than the half period after the reference enable signal 'X2' is enabled.

The first clock 'rclk' and the second clock 'fclk' may be clocks generated from a clock generation circuit included in the semiconductor memory apparatus. Particularly, in a DRAM, the first clock 'rclk' and the second clock 'fclk' may be clocks generated from a delay locked loop (DLL) circuit that generates a clock synchronized with an external clock.

The first output unit 210 generates the first clock 'rclk' as a first internal clock 'rclk_d' when the reference enable signal 'X2' is enabled. The second output unit 220 generates the second clock 'fclk' as a second internal clock 'fclk_d' when the delayed enable signal 'X3' is enabled.

Since the reference enable signal 'X2' is enabled prior to the delayed enable signal 'X3', the first clock 'rclk' is primarily output as the first internal clock 'rclk_d' and then the second clock 'fclk' is output as the second internal clock 'fclk_d'.

Thus, the clock buffer according to the embodiment of the present disclosure allows the first internal clock 'rclk_d' to be output prior to the second internal clock 'fclk_d'. Further, if input terminals of the first clock 'rclk' and the second clock 'fclk' are exchanged, the second internal clock 'fclk_d' can be output prior to the first internal clock 'rclk_d'.

The clock buffer according to the embodiment of the present disclosure can further include a dummy circuit 130. The dummy circuit 130 can receive a supply voltage 'VDD' and the first clock 'rclk'. Preferably, an output terminal of the dummy circuit 130 is in a floating state, that is, has no connection. More preferably, the dummy circuit 130 has the same configuration as that of the first and second delay units 111 and 112, and the delay enable signal generator 120. The dummy circuit 130 is provided to match the load of the first delay unit 111 with the load of the second delay unit 112. In detail, the second clock 'fclk' is input to the first and second delay units 111 and 112, but the first clock 'rclk' is input only to the delay enable signal generator 120 serving as a delay unit, so difference may occur in the load for the clocks 'rclk' and 'fclk'. Due to the difference of the load, signal delay may variously occur. In order to solve this problem, according to the embodiment of the present invention, the first clock 'rclk' is input to the dummy circuit 130, so that the load of the first delay unit 111 can match with the load of the second delay unit 112.

In the embodiment of the present disclosure, the first and second delay units 111 and 112 of the reference enable signal generator 110, the delay enable signal generator 120 and the dummy circuit 130 can be prepared in the form of a flip-flop.

Figure 5:
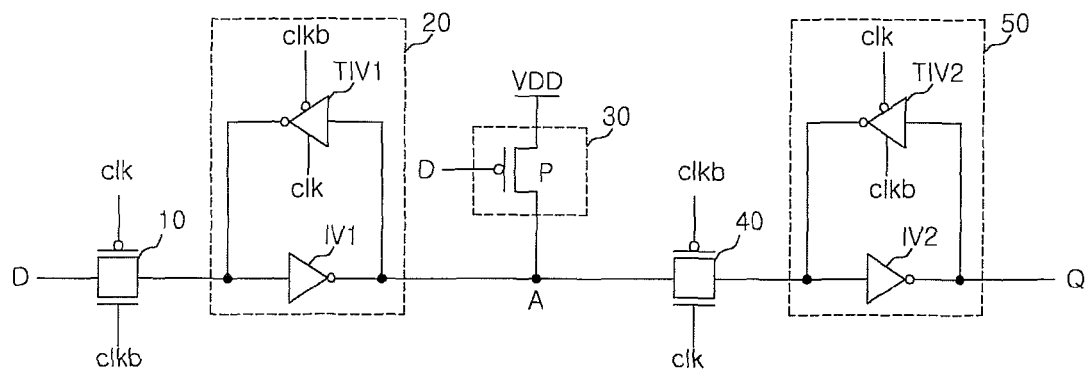
FIG. 5 is a circuit diagram showing a configuration of a flip-flop according to an embodiment of the present disclosure.

FIG. 5 is a circuit diagram showing a configuration of a flip-flop useable as a delay unit or a delay enable signal generator in the embodiment of FIG. 4. Hereinafter, a case in which the flip-flop 100 can be configured to receive input data 'D' and a clock 'clk' to output output data 'Q' will be described as an example.

When the input data 'D' has a first level, the flip-flop 100 can to generate the output data 'Q' having the first level regardless of the input clock 'clk'. When the input data 'D' has a second level, the flip-flop 100 can generate the output data 'Q' transited to the second level in synchronization with a rising edge of the input clock 'clk' and maintained at the second level. Hereinafter, the following description will be given on the assumption that the first level represents a logic low level and the second level represents a logic high level.

The flip-flop 100 can include a first pass gate 10, a first control latch unit 20, a common node driving unit 30, a second pass gate 40 and a second control latch unit 50.

The first pass gate 10 can transmit the input data 'D' when the clock 'clk' has a first level, and to block transmission of the input data 'D' when the clock 'clk' has a second level.

The first control latch unit 20 can perform a latch operation or a simple inversion function in response to the clock 'clk'. For example, when the clock 'clk' has the first level, the first control latch unit 20 can serve as an inverter that inverts the voltage level of the input data 'D' to apply the input data 'D' to a common node 'A'. When the clock 'clk' has the second level, the first control latch unit 20 can latch the current voltage level of the common node 'A'.

The common node driving unit 30 can provide the common node 'A' with the supply voltage 'VDD' in response to the input data 'D'. For example, when the input data 'D' has the first level, the common node driving unit 30 can provide the common node 'A' with the supply voltage 'VDD'. When the input data 'D' has the second level, the common node driving unit 30 can block supply of the supply voltage 'VDD'. When the initial input data 'D' has the first level, since the common node driving unit 30 always sets the common node 'A' to a level (logic high level and the second level in the embodiment of the present disclosure) of the supply voltage 'VDD', the flip-flop 100 can always output the output data 'Q' having the first level regardless of the clock 'clk'.

The second pass gate 40 can transmit data received through the common node 'A' in response to the clock 'clk', or block transmission of the data. For example, when the clock 'clk' has the first level, the second pass gate 40 can block the transmission of the data received through the common node 'A'. When the clock 'clk' has the second level, the second pass gate 40 can transmit the data received through the common node 'A'.

The second control latch unit 50 can perform a latch function or a simple inversion function in response to the clock 'clk'. For example, when the clock 'clk' has the second level, the second control latch unit 50 can invert the data received through the common node 'A' to output the data as the output data 'Q'. When the clock 'clk' has the first level, the second control latch unit 50 can latch the current voltage level of the output data 'Q'.

The first and second pass gates 10 and 40 can each be a general transfer gate. However, phases of clocks input to control terminals of the first and second pass gates 10 and 40 are opposite to each other.

The first control latch unit 20 can include a first inverter 'IV1' and a first three-state inverter 'TIV1' and the second control latch unit 50 can include a second inverter 'IV2' and a second three-state inverter 'TIV2'. The first three-state inverter 'TIV1' has the same configuration as that of the second three-state inverter 'TIV2', except that phases of clocks input to control terminals of the first and second three-state inverter 'TIV1' and 'TIV2' are opposite to each other.

For example, the common node driving unit 30 can be a PMOS transistor 'P' having a gate terminal, which receives the input data 'D', a source terminal, which receives the supply voltage 'VDD', and a drain terminal connected with the common node 'A'.

Figure 6:
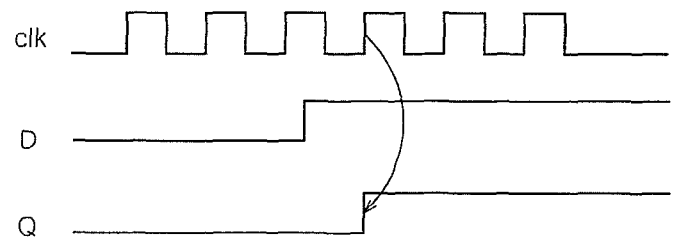
FIG. 6 is a timing chart showing an operation of a flip-flop in FIG. 5.

FIG. 6 is a timing chart showing an operation of the flip-flop in FIG. 5. Referring to FIG. 6, when the input data 'D' has a low level, the flip-flop 100 can output the output data 'Q' having a low level regardless of the clock 'clk'. If the input data 'D' is transited to a high level, the flip-flop 100 can generate the output data 'Q' transited to a high level in synchronization with a rising edge of the clock 'clk' and maintained at the high level.

Hereinafter, the operation of the flip-flop 100 will be described in detail with reference to FIGS. 5 and 6. When the input data 'D' has a low level, the PMOS transistor 'P' of the common node driving unit 30 is turned on, so the common node 'A' is driven at a high level. At this time, even if the clock 'clk' having the first and second levels is repeatedly input, since the common node 'A' is maintained at the high level, the output data 'Q' is continuously maintained at the low level.

If the input data 'D' is transited to the high level, the PMOS transistor 'P' of the common node driving unit 30 is turned off, so the supply voltage 'VDD' is not applied to the common node 'A'. At this time, if the clock 'clk' has the first level, the first pass gate 10 allows the input data 'D' having the high level to pass therethrough, and the first control latch unit 20 inverts the input data 'D' to transfer the data having the low level to the common node 'A'. That is, the common node 'A' becomes a low level. At this time, since the clock 'clk' has the first level, the second pass gate 40 blocks transfer of the data having the low level, which is input through the common node 'A', and the second control latch unit 50 latches the output data 'Q' such that the output data 'Q' is maintained at the low level.

Then, if the clock 'clk' becomes the second level, the first pass gate 10 is blocked and the first control latch unit 20 continuously latches the low voltage level of the common node 'A'. Further, the second pass gate 40 allows the data having the low level, which is input through the common node 'A', to pass therethrough, and the second control latch unit 50 inverts the data to output the output data 'Q' having the high level. Thus, when the input data 'D' becomes the high level, the flip-flop 100 outputs the output data 'Q' transited to the high level in synchronization with the rising edge of the clock 'clk'. If the input data 'D' is maintained at the high level, the output data 'Q' is also continuously maintained at the high level.

Figure 7:
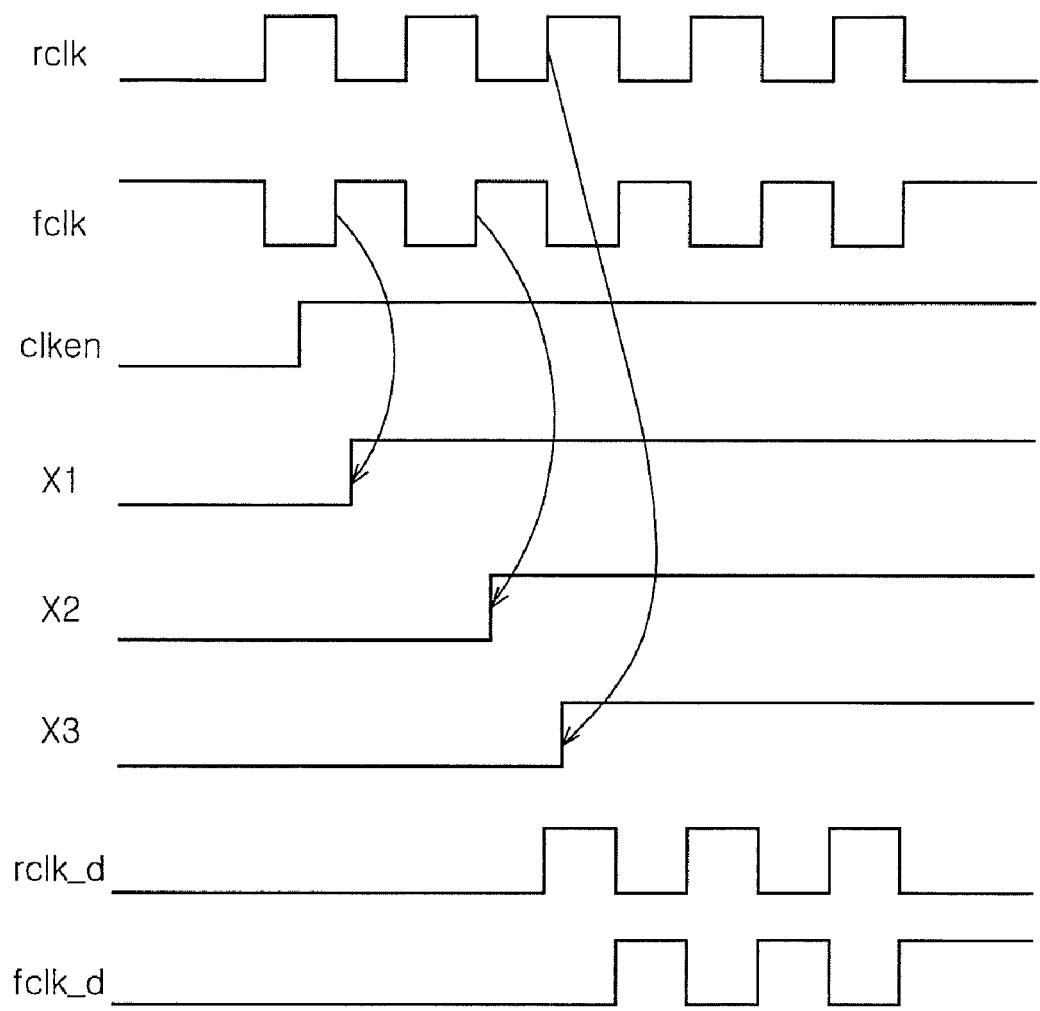
FIG. 7 is a timing chart showing an operation of a clock buffer according to an embodiment of the present disclosure.

FIG. 7 is a timing chart showing the operation of the clock buffer according to the embodiment of the present disclosure. FIG. 7 shows a case in which the clock enable signal 'clken' is enabled when the first clock 'rclk' has a high level and the second clock 'fclk' has a low level.

Referring to FIG. 7, if the clock enable signal 'clken' is enabled to be at a high level, the first delay unit 111 generates the intermediate delay signal 'X1' enabled at a high level in synchronization with the rising edge of a first period of the second clock 'fclk'. After the intermediate delay signal 'X1' is enabled at the high level, the second delay unit 112 generates the reference enable signal 'X2', which is enabled to be at a high level in synchronization with the rising edge of a first period of the second clock 'fclk', in response to the intermediate delay signal 'X1'. After the reference enable signal 'X2' is enabled to be at the high level, the delay enable signal generator 120 generates the delayed enable signal 'X3', which is enabled to be at a high level in synchronization with the rising edge of the first clock 'rclk', in response to the reference enable signal 'X2'.

After the reference enable signal 'X2' is enabled at the high level, the first output unit 210 generates the first clock 'rclk' as the first internal clock 'rclk_d'. After the delayed enable signal 'X3' is enabled at the high level, the second output unit 220 generates the second clock 'fclk' as the second internal clock 'fclk_d'. Thus, the clock buffer according to the embodiment of the present disclosure can primarily output the first clock 'rclk' as the first internal clock 'rclk_d' and then output the second clock 'fclk' as the second internal clock 'fclk_d'.

Figure 8:
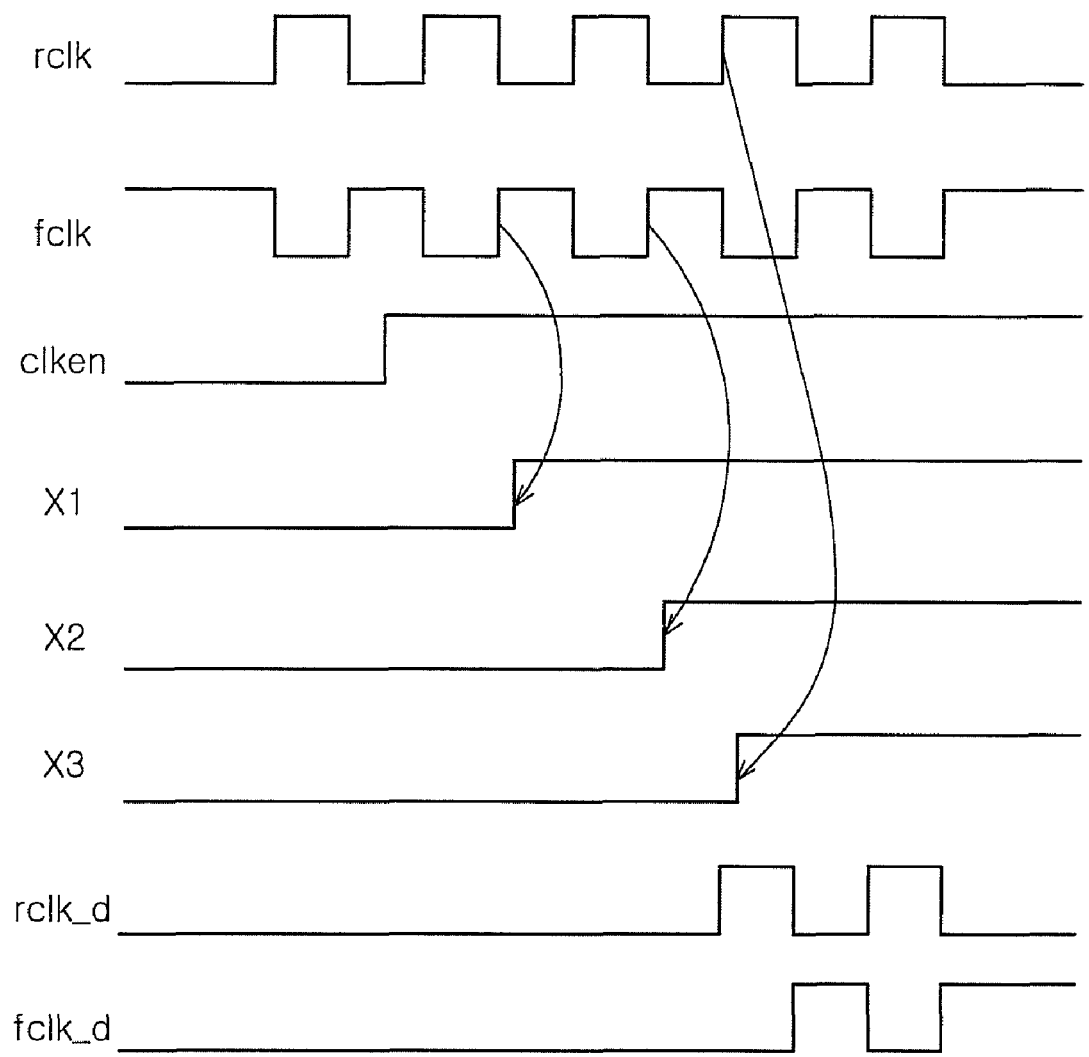
FIG. 8 is a timing chart showing another operation of a clock buffer according to an embodiment of the present disclosure.

FIG. 8 is a timing chart showing the operation of the clock buffer according to the embodiment of the present disclosure, similarly to FIG. 7. FIG. 8 shows a case in which the clock enable signal 'clken' is enabled when the first clock 'rclk' has a low level and the second clock 'fclk' has a high level.

According to the related art, in a case in which the clock enable signal 'clken' is enabled when the second clock 'fclk' has the high level, the conventional clock buffer primarily outputs the second clock 'fclk' as the second internal clock 'fclk_d', so the conventional clock buffer operates abnormally. However, as shown in FIG. 8, the clock buffer according to the embodiment of the present disclosure sequentially enables the intermediate delay signal 'X1', the reference enable signal 'X2' and the delayed enable signal 'X3', thereby primarily outputting the first clock 'rclk' as the first internal clock 'rclk_d' and then outputting the second clock 'fclk' as the second internal clock 'fclk_d'. Thus, the clock buffer can operate normally.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A clock buffer comprising:
a reference enable signal generator configured to generate a reference enable signal enabled in synchronization with a rising edge of a first predetermined period of a second clock after a clock enable signal is enabled;
a delay enable signal generator configured to generate a delayed enable signal enabled in synchronization with a rising edge of a second predetermined period of a first clock after the reference enable signal is enabled;
a first output unit configured to receive the reference enable signal and the first clock to generate a first internal clock; and
a second output unit configured to receive the delayed enable signal and the second clock to generate a second internal clock.

2. The clock buffer of claim 1, wherein the reference enable signal generator includes:
a first delay unit configured to receive the clock enable signal and the second clock to generate an intermediate delay signal; and
a second delay unit configured to receive the intermediate delay signal and the second clock to generate the reference enable signal.

3. The clock buffer of claim 2, wherein the first delay unit is configured to enable the intermediate delay signal in synchronization with a rising edge of a first period of the second clock after the clock enable signal is enabled.

4. The clock buffer of claim 2, wherein the second delay unit is configured to enable the reference enable signal in synchronization with a rising edge of a first period of the second clock after the intermediate delay signal is enabled.

5. The clock buffer of claim 1, wherein the delay enable signal generator is configured to enable the delayed enable signal in synchronization with a rising edge of a first period of the first clock after the reference enable signal is enabled.

6. The clock buffer of claim 1, wherein the first output unit is configured to generate the first clock as the first internal clock after the reference enable signal is enabled.

7. The clock buffer of claim 1, wherein the second output unit is configured to generate the second clock as the second internal clock after the delayed enable signal is enabled.

8. The clock buffer of claim 1, further comprising a dummy circuit configured to receive a supply voltage and the first clock to match load for the first clock with load for the second clock.

9. A semiconductor memory apparatus comprising:
a clock buffer configured to generate a reference enable signal in response to a clock enable signal and a second clock, to generate a delayed enable signal in response to the reference enable signal and a first clock, and to generate first and second internal clocks by synchronizing the first and second clock signals with the reference enable signal and the delayed enable signal; and
a clock synchronization circuit configured to be driven in response to the first and second internal clocks.

10. The semiconductor memory apparatus of claim 9, wherein the clock buffer includes:
a reference enable signal generator configured to generate the reference enable signal enabled in synchronization with a rising edge of a second period of the second clock after the clock enable signal is enabled;
a delay enable signal generator configured to generate the delayed enable signal enabled in synchronization with a rising edge of a first period of the first clock after the reference enable signal is enabled;
a first output unit configured to receive the reference enable signal and the first clock to generate the first internal clock; and
a second output unit configured to receive the delayed enable signal and the second clock to generate the second internal clock.

11. The semiconductor memory apparatus of claim 10, wherein the reference enable signal generator includes:
a first delay unit configured to receive the clock enable signal and the second clock to generate an intermediate delay signal; and
a second delay unit configured to receive the intermediate delay signal and the second clock to generate the reference enable signal.

12. The semiconductor memory apparatus of claim 11, wherein the first delay unit is configured to enable the intermediate delay signal in synchronization with a rising edge of a first period of the second clock after the clock enable signal is enabled.

13. The semiconductor memory apparatus of claim 11, wherein the second delay unit is configured to enable the reference enable signal in synchronization with a rising edge of a first period of the second clock after the intermediate delay signal is enabled.

14. The semiconductor memory apparatus of claim 10, wherein the first output unit is configured to generate the first clock as the first internal clock after the reference enable signal is enabled.

15. The semiconductor memory apparatus of claim 10, wherein the second output unit is configured to generate the second clock as the second internal clock after the delayed enable signal is enabled.

16. The semiconductor memory apparatus of claim 10, further comprising a dummy circuit configured to receive a supply voltage and the first clock to match load for the first clock with load for the second clock.

* * * * *